United States Patent [19]
Goldman

[11] Patent Number: 5,371,407
[45] Date of Patent: Dec. 6, 1994

[54] ELECTRONIC CIRCUIT WITH DIAMOND SUBSTRATE AND CONDUCTIVE VIAS

[75] Inventor: Paul D. Goldman, Marlboro, Mass.
[73] Assignee: Norton Company, Worcester, Mass.
[21] Appl. No.: 55,265
[22] Filed: Apr. 28, 1993

Related U.S. Application Data

[62] Division of Ser. No. 712,021, Jun. 7, 1991, Pat. No. 5,239,746.
[51] Int. Cl.⁵ .................................. H01L 23/02
[52] U.S. Cl. .................... 257/675; 257/700; 257/702; 257/707; 257/713; 437/203; 361/708; 361/739
[58] Field of Search .......... 257/77, 700, 702, 717, 257/774, 675, 713, 707; 361/410, 414, 708, 739; 428/901; 437/203, 192

[56] References Cited

U.S. PATENT DOCUMENTS

| | | | |
|---|---|---|---|
| 4,009,027 | 2/1977 | Naidich et al. | 75/154 |
| 4,131,516 | 12/1978 | Bakos et al. | 204/15 |
| 4,313,262 | 2/1982 | Barnes et al. | 29/840 |
| 5,055,424 | 10/1991 | Zeidler et al. | 437/188 |
| 5,133,120 | 7/1992 | Kawakami et al. | 29/852 |

FOREIGN PATENT DOCUMENTS

| | | |
|---|---|---|
| 2-23639 | 1/1990 | Japan. |
| 2023639 | 1/1990 | Japan. |

*Primary Examiner*—William D. Larkins
*Assistant Examiner*—John F. Guay
*Attorney, Agent, or Firm*—Volker R. Ulbrich; Martin M. Novack

[57] ABSTRACT

The use of a conductive reactive braze material, loaded in via holes of a diamond substrate and heated in a suitable temperature range, results in conductive vias with excellent adherence to the via hole in the diamond material. Cracking of the diamond substrate, and loose or lost via elements, are minimized. A form of the disclosure is directed to a method for producing a circuit board having a multiplicity of conductive vias. A generally planar diamond substrate is provided. A multiplicity of via holes are formed through the substrate. The holes are loaded with a conductive reactive braze material. The braze material and the substrate are heated to a temperature which causes the braze material to melt and to react with the inner surface of the via holes and bond thereto. In an illustrated embodiment, the braze material comprises a conductive matrix component that includes at least one element selected from the group consisting of copper, silver, and gold, and a reactive component that includes at least one element selected from the group consisting of titanium, chromium, vanadium, zirconium, and hafnium. Another form of the disclosure is directed to a circuit board in which conductive vias pass through a diamond substrate and form a compound with the substrate at the inner surface of the via holes to bond to said inner surface of the via holes.

3 Claims, 2 Drawing Sheets

ELECTRONIC CIRCUIT WITH DIAMOND SUBSTRATE AND CONDUCTIVE VIAS

This is a division of copending U.S. application Ser. No. 712,021 filed Jun. 7, 1991, now U.S. Pat. No. 5,239,746.

FIELD OF THE INVENTION

This invention relates to electronic circuits and their fabrication and, more particularly, to improvements in electronic circuits and circuit boards and to fabrication methods which utilize diamond substrates.

BACKGROUND OF THE INVENTION

A serious constraint in the increase of packing density of electronic integrated circuits is their thermal management; i.e., the ability to effectively carry away the heat generated by the electronic circuit elements (e.g. semiconductor chips and other components). The density of heat generating devices and their operating frequency (since the power dissipation of some types of circuits increases with frequency) both contribute to the problem of heat generation.

A heat sink can be incorporated within the circuit board or substrate material on which the circuit elements are mounted in some applications. The effectiveness of the heat sink increases with increasing thermal conductivity of the heat sink material. Diamond has the highest thermal conductivity ($k=2000$ W/m degree K at 300 degrees K) of any known material. Silver, copper and aluminum (with $k=430$, 400 and 240, respectively, at 300 degrees K) are among the best cheaper alternative heat sink materials, but are electrical conductors, requiring special electrical insulating steps if isolated conductors must be passed through the material. Also, silver and copper (which are better thermal conductors than aluminum) are much heavier per unit volume than diamond. A further advantage of diamond is that its thermal expansion coefficient is a better match to that of silicon than most other heat sink materials. Diamond has been suggested and used as a heat sink material for electronic devices and circuits because of its superior thermal conductivity and insulating properties, but its practical use has been limited by its cost/benefit ratio in circuit applications where alternative heat sinking materials may be more readily provided in the necessary sizes and shapes, and where such alternate materials are operationally adequate.

The cost/benefit ratio for diamond in circuit applications has improved, and will improve further, with the advent of better techniques for the production of synthetic diamond. In the copending U.S. patent application Ser. No. 592,209, filed Oct. 3, 1990, assigned to the same assignee as the present Application, there is described a circuit, such as a computer processor, which utilizes a multiplicity of generally planar diamond substrate layers and a multiplicity of generally planar spacer boards formed of insulating material. Each of the substrate layers has mounted thereon a multiplicity of electronic circuit elements and conductive means for coupling between electronic circuit elements. ["Circuit elements" generally includes active as well as passive devices or components of any kind used in electronic or electro-optical applications.] Some or all of the electronic circuit elements on the substrate layers may be integrated circuit chips. The substrate layers and spacer boards are stacked in alternating fashion so that spacer boards are interleaved between adjacent substrate layers. Each of the spacer boards has a multiplicity of electrical conductors extending through its planar thickness to effect coupling between circuit elements on the substrate layers on its opposing sides. Also, each diamond substrate layer has a multiplicity of electrical conductors or "vias" passing through its thickness, the vias coupling conductors on opposite sides of the substrate.

In a circuit of the type described in the referenced copending U.S. patent application, it is necessary to provide the multiplicity of conductive vias which pass through so-called "via holes" from one surface of the diamond substrate layer to the other. As noted therein, the via holes can be laser drilled and edge treated, if necessary, to remove local graphitization of the diamond. The via holes can be metal filled using plating or conventional metal paste filling. Conductive epoxy filling could also be used, but may give less reliable, higher resistance contacts to the metallization layers on the top and bottom surfaces of the substrate.

Prior art techniques for filling via holes with conductive material have been found to suffer certain disadvantages when utilized in filling the via holes in diamond substrates. One problem is cracking of the diamond substrate due to differences in the coefficients of expansion of the diamond material and the filling metal. Another problem is shrinking of the metal upon cooling, whereupon the formed conductive via can fall out of the via hole or loosen therein.

It is among the objects of the present invention to provide solution to the described problem, and to set forth an improved technique for fabricating conductive via hole connections through a diamond substrate for utilization in an electronic circuit.

SUMMARY OF THE INVENTION

Applicant has discovered that the use of a conductive reactive braze material, loaded in via holes of a diamond substrate and heated in a suitable temperature range, results in conductive vias with excellent adherence to the via hole in the diamond material. Cracking of the diamond substrate, and loose or lost via elements, are minimized.

A form of the present invention is directed to a method for producing a circuit board having a multiplicity of conductive vias. [As used herein, the term "conductor" or "conductive" means an electrical conductor or electrically conductive (as the case may be), unless otherwise specified. Also, "circuit board" is intended to generically include useful circuit board building blocks, such as a substrate with conductors therein to which electronic circuit elements will ultimately be coupled, as well as to a completed or partially completed circuit board which has electronic circuit elements mounted thereon.] A generally planar diamond substrate is provided. A multiplicity of via holes are formed through the substrate. The holes are loaded with a conductive reactive braze material. The braze material and the substrate are heated to a temperature which causes the braze material to melt and to react with the inner surface of the via holes and bond thereto.

In a preferred embodiment of this form of the invention, the braze material comprises a conductive matrix component that includes at least one element selected from the group consisting of copper, silver, and gold, and a reactive component that includes at least one element selected from the group consisting of titanium, chromium, vanadium, zirconium and hafnium. In one preferred braze material, the conductive matrix component includes copper and silver, and the reactive component includes titanium. In this embodiment, the braze material is preferably a paste comprising said elements in a powdered form (that is, a powder of a mixture of elements and/or an alloy or alloys of said elements) mixed with a surfactant and a carrier vehicle.

Another form of the invention is directed to a method of producing an electronic circuit having at least one conductive via hole through a diamond substrate, and a further form of the invention is directed to the structure of a circuit board in which conductive vias pass through a diamond substrate and form a compound with the substrate at the inner surface of the via holes to bond to said inner surface of the via holes.

The invention provides solution to the problem of forming mechanically stable and permanent conductive vias in a diamond substrate, without damaging the substrate.

Further features and advantages of the invention will become more readily apparent from the following detailed description when taken in conjunction with the accompanying drawings.

DESCRIPTION OF THE PREFERRED EMBODIMENTS

Figure 1:
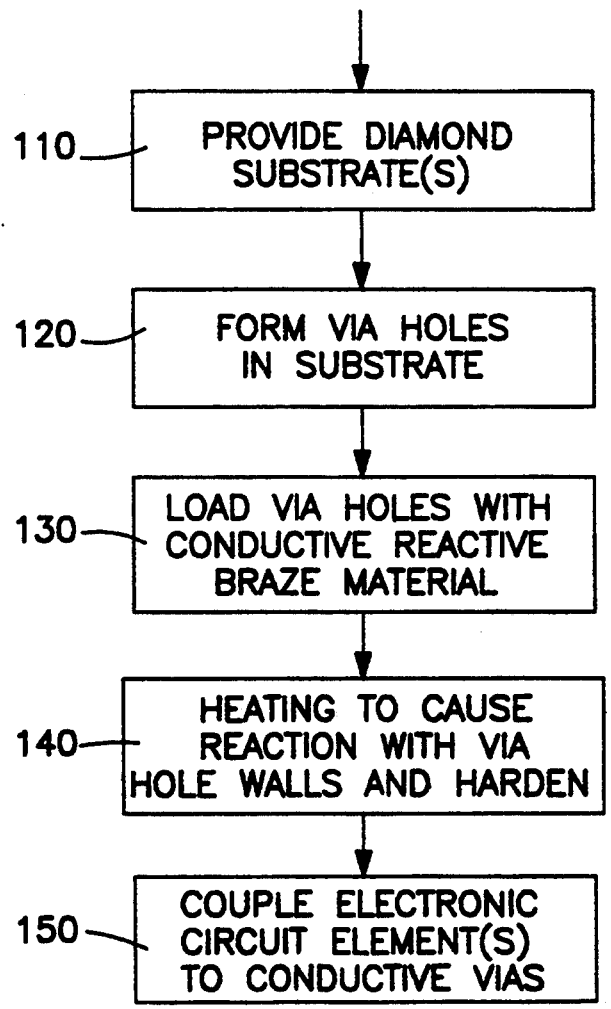
FIG. 1 is sequence diagram of the steps for practicing an embodiment of the method of the invention.

Referring to FIG. 1, there is shown a flow diagram of the sequence of operations utilized in accordance with an embodiment of the method of the invention and which can be employed to fabricate a circuit in accordance with a form of the invention. The block 110 represents the step of providing one or more layers of diamond substrate which, in the present embodiment, are synthetic. [As used herein, "diamond" is intended to mean natural or synthetic diamond or diamond-like substances having a thermal conductivity of the order of the thermal conductivity of diamond.] Synthetic diamond can be grown, for example, by the method of chemical vapor deposition (CVD), such as the use of a hydrogen d.c. arc torch with a small percentage (e.g. 1 percent) methane carbon source. Diamond CVD growth technology is known in the art and is reviewed, for example, in the article by R. C. DeVries in the Annual Reviews of Materials Science), Vol. 17, pg. 161 (1987). Reference can also be made to Proceedings of the "First International Symposium on Diamond and Diamond-Like Films", The Electrochemical Society, Pennington, N.J., Proceedings Vol. 89-12 (1989); B. V. Spitzyn, L. L. Boulov, and B. V. Derjaguin, Progress in Crystal Growth and Characterization 17, pg. 79 (1988); P. D. Gigl, New Synthesis Techniques, Properties, And Applications For Industrial Diamond, IDA Ultrahard Materials Seminar, Toronto, Canada (September, 1989) as well as to equipments and techniques disclosed in U.S. Pat. Nos. 4,471,003, 4,487,169, 4,691,662, 4,630,566, 4,585,668 and 4,507,588.

Figure 2:
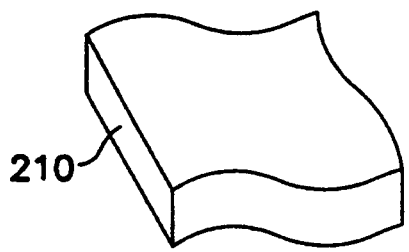
FIGS. 2–5 show a portion of the diamond substrate at different stages of the circuit board fabrication procedure.

FIG. 2 illustrates a portion of a planar substrate 210, which, for example, may ultimately become one of a multiplicity of substrate layers of a circuit of the type described in the above referenced copending U.S. patent application Ser. No. 592,209. It will be understood, however, that the principles of the present invention are applicable to circuits which employ only a single diamond substrate.

Figure 3:
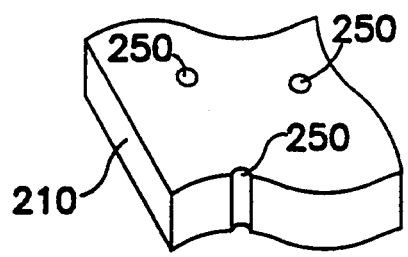

The block 120 represents the formation of a multiplicity of via holes in the substrate, as illustrated in FIG. 3. The via holes are preferably formed using a laser drilling technique. Laser drilling is known in the art and does not, of itself, constitute a novel feature of the present invention. The resultant laser drilled via holes, illustrated in FIG. 3 at 250, are seen to be generally cylindrical or conical bores through the substrate 210. The substrate may be, as an example, about 1 mm thick, with via holes having a diameter, for example, in the range about 0.05 mm to 0.1 mm.

Figure 4:
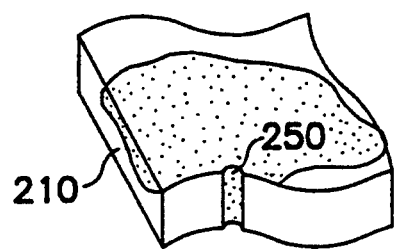
Figure 5:
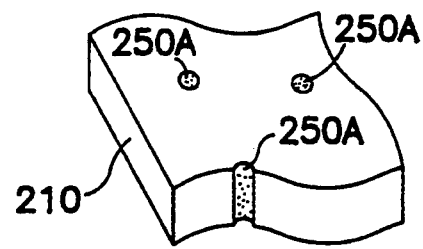

The block 130 of FIG. 1 represents the loading of the via holes with a conductive reactive braze material. This can be done in any suitable way, for example by applying a paste of the braze material to one or both surfaces of the substrate, the paste having a sufficient viscosity to readily fill the via holes (e.g. FIG. 4). If desired the substrate may be pressed on moist braze paste. Excess can be scraped from the substrate surfaces, the scraping also serving to ensure filling of the via holes (e.g. FIG.5). The braze material hereof is conductive and reactive; i.e., it is comprised mostly of electrically conductive metals (such as copper, silver, and/or gold), and contains a small fraction (such as about 0.1% to 10%) of a metal which will react with the diamond substrate to form a compound therewith. In an embodiment hereof, the reactive component is titanium which reacts, upon heating, with the carbon of the diamond substrate to produce titanium carbide. The reactive component is important in obtaining a good bond with the wall surface of the via hole. Other reactive components such as chromium vanadium, zirconium, and/or hafnium could be used. The braze material is preferably in a form of a paste comprising a powder of the conductive and reactive metals. The reactive component should not substantially compromise the conductivity of the resultant via, so as small a percentage as will provide the desired bonding is preferred. The powder can be an alloy of the conductive and reactive braze constituents or can be a mixture of these constituents. As is typical for some braze materials, the braze powder can be in the form of a paste obtained by mixing the powder with a suitable surfactant and carrier vehicle. It will be understood that the braze materials utilized in the present invention can be of other forms, although a paste is particularly suitable for the present application.

The block 140 represents heating of the conductive and reactive braze material in the substrate via holes. In the present embodiment, this can be implemented by heating in a vacuum or inert atmosphere to a temperature in the range about 750 to 950 degrees Centigrade for a few minutes.

Figure 6:
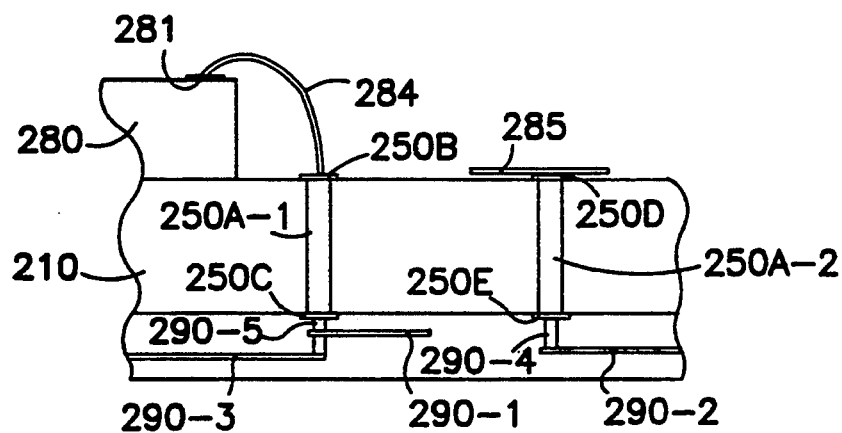
FIG. 6 shows a portion of a circuit in accordance with an embodiment of the invention.

The block 150 represents the coupling of electronic circuit elements to at least some of the conductive vias (250A) that have been formed in the substrate 210. FIG. 6 illustrates a portion of the diamond substrate 210 and two of the conductive vias 250A-1 and 250A-2 produced in accordance with the technique of the present invention, and as previously described. In the illustrative example, the substrate 210 has electronic circuit elements, such as integrated circuit chips 280 (one of which is illustrated in FIG. 6) mounted on one surface thereof, and patterns of conductors 290 on the opposing surface thereof. More specifically, each of the conductive vias 250A-1 and 250A-2 has a metallization pad formed on both its ends, as shown. The pad 250B on top of via 250A-1 is coupled by conventional lead bonding to an integrated circuit chip 280. The lead 284 is coupled between pad 250B and one of the pads 281 of chip 280. The pad 250D on top of via 250A-2 is coupled to a conductor 285 which is ultimately coupled to another circuit element (not shown) on the same surface of substrate 210. The pad 250D on top of via 250A-2 is coupled to a conductor 285 that may, for example, be ultimately coupled to another electronic circuit element (not shown) on the substrate or to other destinations external to the substrate. The opposing surface of the substrate has one or more layers of metallizations, forming conductors such as are shown at 290-1, 290-2 and 290-3, the metallizations being separated by an insulator such as BCB (benzocyclobutene), and at least some of these conductors being coupled, directly or indirectly, with the conductive vias 250A-1 and 250A-2, as illustrated in the Figure at 290-4 and 290-5. Techniques for applying and etching the metal layers using photolithographic techniques are well known in the art and are not, of themselves, inventive features hereof. Reference can be made, for example, to Tummala et al., "Microelectronics Packaging Handbook", Van Nostrand Reinhold (1989). Reference can also be made to the above-referenced copending U.S. patent application Ser. No. 592,209 for further details. It will be understood that any suitable circuit board configuration, for example one which contains electronic circuit elements on one or both substrate surfaces and/or one or more layers of conductors on one or both surfaces of the substrate, can be fabricated consistent with the principles of the invention.

EXAMPLE

Circuit boards in accordance with a form of the invention were fabricated using synthetic diamond substrates having a thickness of about 1 mm and produced by chemical vapor deposition. Via holes were drilled in the diamond substrates using a laser drilling technique. The holes were approximately cylindrical and had a diameter of about 0.07 mm. A conductive and reactive braze paste was utilized to lead the via holes by applying the moist paste to the substrate and scraping the excess. The braze paste used in this example was 68% silver, 27% copper and 5% titanium, and is sold by Lucas-Milhaupt, Inc. This braze paste is commonly used in the art for bonding diamond to other materials, and for other bonding purposes. The substrate, with braze material in the via holes, was preheated for about one minute at about 500 degrees Centigrade to drive off most of the volatile constituents, and then heated at about 900 degrees Centrigrade for about two minutes. The substrate was then brought down in steps, of at least three minutes each, to 600 degrees Centigrade and 300 degrees Centigrade before being permitted to cool to room temperature. The substrate surfaces were then lapped smooth. Tight stable conductive vias, bonded in their via holes, were observed.

The invention has been described with reference to particular preferred embodiments, but variations within the spirit and scope of the invention will occur to those skilled in the art. For example, it will be understood that a substrate utilized as a heat sink, with only a single conductive via therethrough, can be fabricated in accordance with the principles of the invention. Also, other forms of braze material may be utilized. For example, the braze material may be in a wire form and automatically inserted into the via holes.

I claim:

1. An electronic circuit, comprising:

a generally planar diamond substrate having a multiplicity of via holes therein;

said via holes being filled with a conductive reactive braze material that has been heated to form conductive vias that fill said via holes without extending substantially outside said via holes and form a carbide compound at the inner surfaces of said via holes to bond with said inner surfaces;

electronic circuit elements mounted on at least one surface of said substrate and coupled to at least some of said conductive vias; and conductive connections coupled with at least some of said conductive vias on the opposing surface of said substrate.

2. The circuit as defined by claim 1, wherein said braze material comprises a conductive matrix component that includes at least one element selected from the group consisting of copper, silver, and gold, and a reactive component that includes at least one element selected from the group consisting of titanium, chromium, vanadium, zirconium, and hafnium.

3. The circuit as defined by claim 2, wherein said conductive matrix component comprises copper and silver and said reactive component comprises titanium.

* * * * *